United States Patent
Tazawa et al.

(10) Patent No.: US 9,972,972 B2
(45) Date of Patent: May 15, 2018

(54) VERTICAL CAVITY LIGHT EMITTING DEVICE

(71) Applicant: STANLEY ELECTRIC CO., LTD., Meguro-ku, Tokyo (JP)

(72) Inventors: Komei Tazawa, Kawasaki (JP); Ji-Hao Liang, Tachikawa (JP); Seiichiro Kobayashi, Tokyo (JP); Masaru Takizawa, Yokohama (JP); Keisuke Nakata, Zama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 31 days.

(21) Appl. No.: 15/347,267

(22) Filed: Nov. 9, 2016

(65) Prior Publication Data

US 2017/0149213 A1    May 25, 2017

(30) Foreign Application Priority Data

Nov. 20, 2015  (JP) .................................. 2015-227165

(51) Int. Cl.
*H01S 5/183* (2006.01)
*H01S 5/042* (2006.01)

(52) U.S. Cl.
CPC ........ *H01S 5/18361* (2013.01); *H01S 5/0425* (2013.01); *H01S 5/18308* (2013.01)

(58) Field of Classification Search
CPC .......... H01S 5/18308–5/18338; H01S 5/0425; H01S 5/18341
See application file for complete search history.

(56) References Cited

U.S. PATENT DOCUMENTS

| 4,495,514 A | 1/1985 | Lawrence et al. |
| 2010/0098127 A1 | 4/2010 | Higuchi et al. |

(Continued)

FOREIGN PATENT DOCUMENTS

| JP | 2005158922 A | * | 6/2005 | ......... H01S 5/18377 |
| JP | 2007123313 A | * | 5/2007 | .......... H01S 5/18311 |

(Continued)

OTHER PUBLICATIONS

Extended European Search Report (EESR) dated Apr. 17, 2017, issued in counterpart European Application No. 16199102.1.

*Primary Examiner* — Joshua King
(74) *Attorney, Agent, or Firm* — Holtz, Holtz & Volek PC

(57) ABSTRACT

A vertical cavity light emitting device includes: a first multilayer film reflector; a semiconductor structure layer that is formed on the first multilayer film reflector and includes a semiconductor layer of a first conductivity type, an active layer, and a semiconductor layer of a second conductivity type opposite to the first conductivity type; an insulating current confinement layer formed on the semiconductor layer of the second conductivity type; a through opening formed in the current confinement layer; a transparent electrode for covering the through opening and the current confinement layer, the transparent electrode being in contact with the semiconductor layer of the second conductivity type through the through opening; a second multilayer film reflector formed on the transparent electrode; and a mixed composition layer formed to be in contact with an edge of the through opening and in which the current confinement layer and the transparent electrode are mixed.

9 Claims, 8 Drawing Sheets

(56) References Cited

U.S. PATENT DOCUMENTS

| | | | |
|---|---|---|---|
| 2010/0148202 A1 | 6/2010 | Tomoda | |
| 2010/0232465 A1* | 9/2010 | Tsukiji | H01S 5/0425 372/45.01 |
| 2011/0121337 A1 | 5/2011 | Shakuda | |
| 2012/0008659 A1* | 1/2012 | Kawakita | H01S 5/18311 372/45.01 |
| 2015/0099317 A1* | 4/2015 | Hayakawa | H01S 5/02476 438/27 |
| 2017/0070033 A1* | 3/2017 | Hayakawa | H01S 5/18311 |

FOREIGN PATENT DOCUMENTS

| | | | | |
|---|---|---|---|---|
| JP | 2011029607 A | | 2/2011 | |
| JP | 2012015139 A | * | 1/2012 | H01S 5/18386 |

* cited by examiner

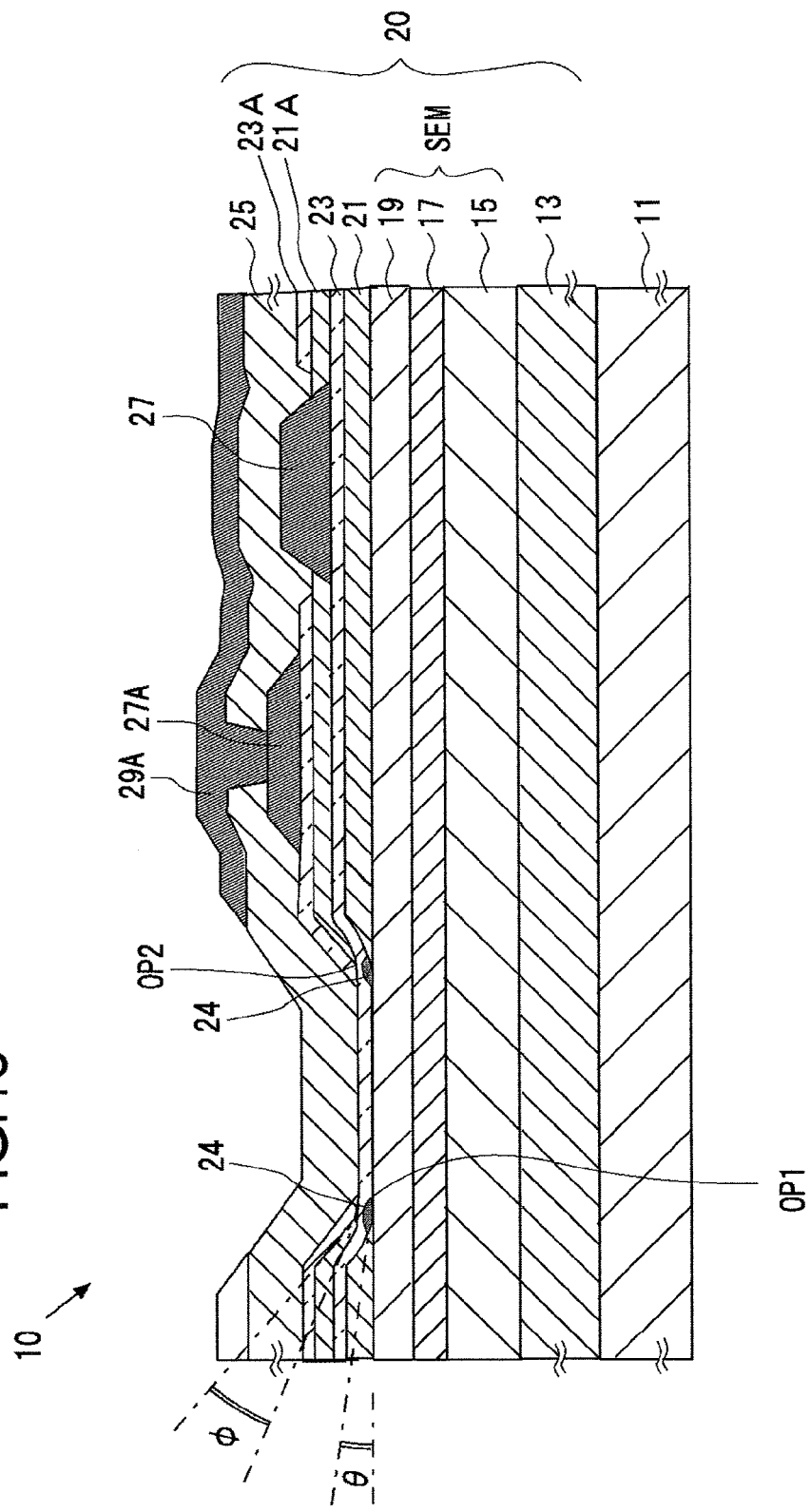

VERTICAL CAVITY LIGHT EMITTING DEVICE

BACKGROUND OF THE INVENTION

1. Field of the Invention

The present invention relates to a vertical cavity light emitting device, such as a vertical cavity surface emitting laser (VCSEL).

2. Description of the Related Art

A vertical cavity surface emitting laser is a type of semiconductor laser configured so that light is resonated vertically with respect to a substrate surface and emitted in a vertical direction to the substrate surface. For example, Japanese Patent Application Laid-Open No. 2011-29607 (Patent Literature 1) discloses a vertical cavity surface emitting laser having, on at least one surface of a nitride semiconductor layer, an insulation layer having an opening, a translucent electrode disposed on the insulation layer so as to cover the opening, and a reflecting mirror above the opening with the translucent electrode interposed therebetween.

SUMMARY OF THE INVENTION

A vertical cavity light emitting device, such as a vertical cavity surface emitting laser, has reflecting mirrors that are opposite to each other with a light emitting layer interposed therebetween, and these reflecting mirrors form a resonator or cavity. In a vertical cavity surface emitting laser, for example, a reflecting mirror can be formed by alternately laminating two types of thin films with different refractive indexes.

To lower the lasing threshold current of a vertical cavity surface emitting laser, it is desirable that a reflecting mirror have high reflection characteristics. It is preferable that the current applied to the vertical cavity surface emitting laser be injected to a light emitting layer without loss.

However, in the conventional vertical cavity surface emitting laser, an opening of an insulation layer through which a current is injected to a light emitting layer without loss is not adequately addressed.

The present invention has been made in view of the foregoing problem. It is an object of the present invention to provide a vertical cavity light emitting device that can reduce the threshold current and enhance the manufacturing yield.

According to one aspect of the present invention, there is provided a vertical cavity light emitting device including:

a first multilayer film reflector formed on a substrate;

a semiconductor structure layer that is formed on the first multilayer film reflector and includes a semiconductor layer of a first conductivity type, an active layer, and a semiconductor layer of a second conductivity type which is opposite to the first conductivity type;

an insulating current confinement layer formed on the semiconductor layer of the second conductivity type;

a through opening that is formed in the current confinement layer to penetrate the current confinement layer;

a transparent electrode for covering the through opening and the current confinement layer, the transparent electrode being in contact with the semiconductor layer of the second conductivity type through the through opening;

a second multilayer film reflector formed on the transparent electrode; and a mixed composition layer that is formed so as to be in contact with an edge of the through opening and in which the current confinement layer and the transparent electrode are mixed.

BRIEF DESCRIPTION OF THE DRAWINGS

FIG. 13 is a cross-sectional view schematically illustrating a part of a configuration of a vertical cavity surface emitting laser according to a modified example of the third embodiment of the present invention.

DETAILED DESCRIPTION OF THE INVENTION

Figure 1:
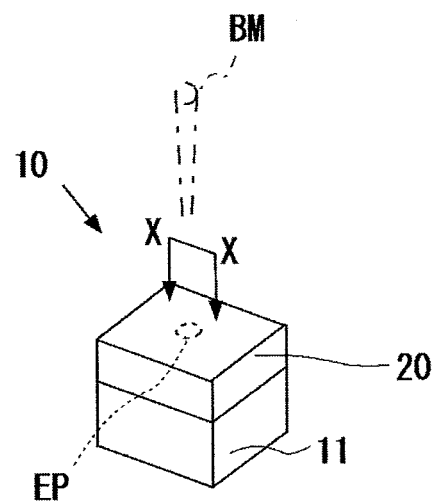
FIG. 1 is a perspective view schematically illustrating a configuration of a vertical cavity surface emitting laser according to a first embodiment of the present invention.

A vertical cavity surface emitting laser (hereinafter also simply referred to as "surface emitting laser"), which is one example of the vertical cavity light emitting device according to the present invention, will now be described with reference to the drawings. In the following description and the accompanying drawings, the substantially same or equivalent parts will be denoted by the same reference numerals.

The present inventor has focused on an opening portion of a current confinement layer that is an insulation layer. Also, the present inventor has researched and experimented the relationship between a side wall of the opening portion and the lasing threshold current of a surface emitting laser. As a result, the present inventor has found the structure capable of reducing the threshold current and reached the present invention.

First Embodiment

FIG. 1 is a perspective view schematically illustrating a configuration of a surface emitting laser 10 according to a first embodiment of the present invention. As illustrated in FIG. 1, the surface emitting laser 10 includes an emission port EP of a laser beam BM. The surface emitting laser 10 has a resonant portion 20 formed on a semiconductor substrate 11.

Figure 2:
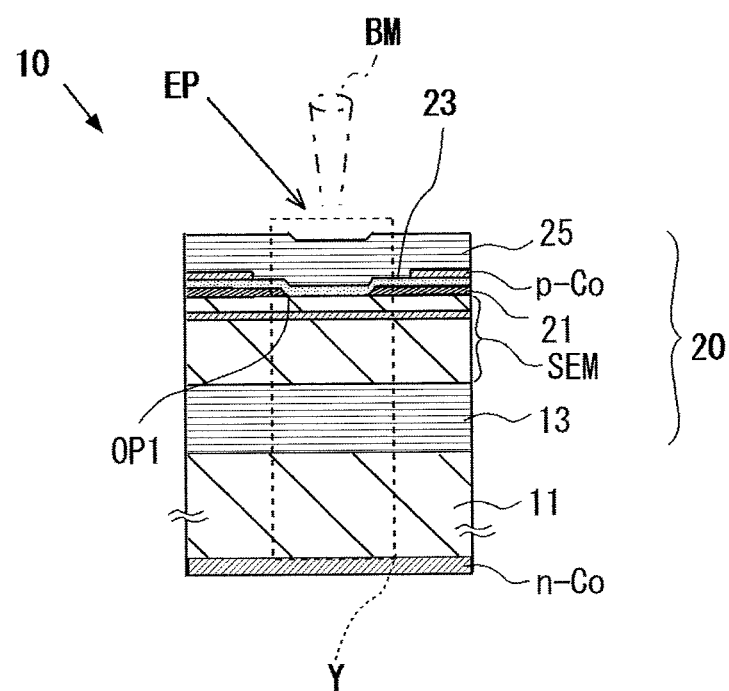
FIG. 2 is a partial cross-sectional view schematically illustrating a part of the vertical cavity surface emitting laser along a line XX of FIG. 1.

FIG. 2 is a partial cross-sectional view schematically illustrating a part of the surface emitting laser 10 along a line XX of FIG. 1.

As illustrated in FIG. 2, for example, a light emitting portion of the surface emitting laser 10 includes the resonant portion 20 formed on the conductive substrate 11 comprising GaN (gallium nitride), the resonant portion 20 including a conductive first multilayer film reflector 13; a semiconductor structure layer SEM; an insulating current confinement layer; a transparent electrode 23; a p-contact layer p-Co; and a second multilayer film reflector 25. The semiconductor structure layer SEM is constituted by a GaN semiconductor. An n-contact layer n-Co is formed on the surface opposite to the p-contact layer p-Co of the substrate 11. A through opening OP1 of the current confinement layer formed directly below the transparent electrode 23 of the resonant portion 20 (i.e., interface between the transparent electrode 23 and the semiconductor structure layer SEM) corresponds to the emission port EP of the laser beam BM.

In this embodiment, the first multilayer film reflector 13 and the second multilayer film reflector 25 are each formed as a distributed Bragg reflector (DBR). The semiconductor structure layer SEM is interposed between the first multilayer film reflector 13 and the second multilayer film reflector 25 so as to define a resonator structure. To achieve desirable conductivity, insulation property, and refractive index, the first multilayer film reflector 13 and the second multilayer film reflector 25 are formed by properly adjusting, for example, materials, film thicknesses, and the number of pairs of multilayer films. For example, an insulating multilayer film reflector is formed from a dielectric multilayer film. Examples of the thin film materials for a reflector may include oxides of metals, semimetals, etc.; or nitrides, such as AlN, AlGaN, GaN, BN, and SiN. An insulating multilayer film reflector can be obtained by regularly and alternately laminating at least two dielectric thin films with different refractive indexes, such as $SiO_2/Nb_2O_5$, $SiO_2/ZrO_2$, $SiO_2/AlN$, and $Al_2O_3/Nb_2O_5$.

Figure 3:
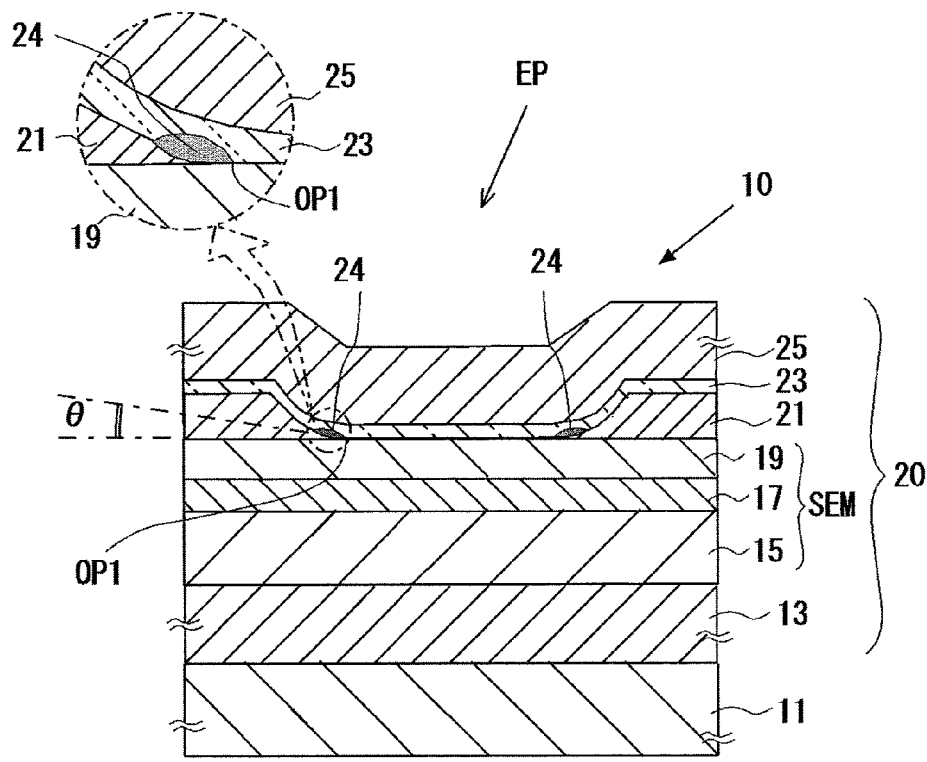
FIG. 3 is a partial cross-sectional view schematically illustrating a part of the vertical cavity surface emitting laser encircled by a dashed line Y of FIG. 2.

FIG. 3 is a partial cross-sectional view schematically illustrating a part of the surface emitting laser 10 encircled by a dashed line Y of FIG. 2.

The semiconductor structure layer SEM is formed from layers on the first multilayer film reflector 13, i.e., an n-type semiconductor layer 15, an active layer 17 including a quantum well layer, and a p-type semiconductor layer 19, in this order. In this embodiment, each layer of the first multilayer film reflector 13 and the semiconductor structure layer SEM has the composition of $Al_xIn_yGa_{1-x-y}N$ ($0 \leq x \leq 1$, $0 \leq y \leq 1$, $0 \leq x+y \leq 1$). For example, the structure of the first multilayer film reflector 13 is configured such that a low-refractive index semiconductor layer with the composition of AlInN and a high-refractive index semiconductor layer with the composition of GaN are alternately laminated to form a laminated structure of a plurality of pairs of the low-refractive index and high-refractive index semiconductor layers. Also, in this embodiment, the active layer 17 has a quantum well structure configured such that a well layer (not shown) with the composition of InGaN and a barrier layer (not shown) with the composition of GaN are alternately laminated to form a laminated structure of a plurality of pairs of the well layer and the barrier layer. The n-type semiconductor layer 15 has the composition of GaN and contains Si as an n-type impurity. The p-type semiconductor layer 19 has the composition of GaN and contains Mg, etc. as a p-type impurity. The n-type semiconductor layer 15 and the p-type semiconductor layer 19 are thereby of opposite conductivity types.

Also, in this embodiment, a buffer layer (not shown) is formed between the substrate 11 and the first multilayer film reflector 13. The first multilayer film reflector 13 and the semiconductor structure layer SEM are formed using, for example, a metal organic chemical vapor deposition (MOCVD) method.

The insulating current confinement layer 21 is formed on the p-type semiconductor layer 19 and has the through opening OP1. The transparent electrode 23 is formed over the current confinement layer 21 and the p-type semiconductor layer 19 so as to cover the through opening OP1 and to be in contact with the p-type semiconductor layer 19. The current confinement layer 21 allows a current to be injected from the transparent electrode 23 to the active laser 17 via the through opening OP1. The current confinement layer 21 blocks injection of a current through a portion other than the through opening OP1.

Figure 4:
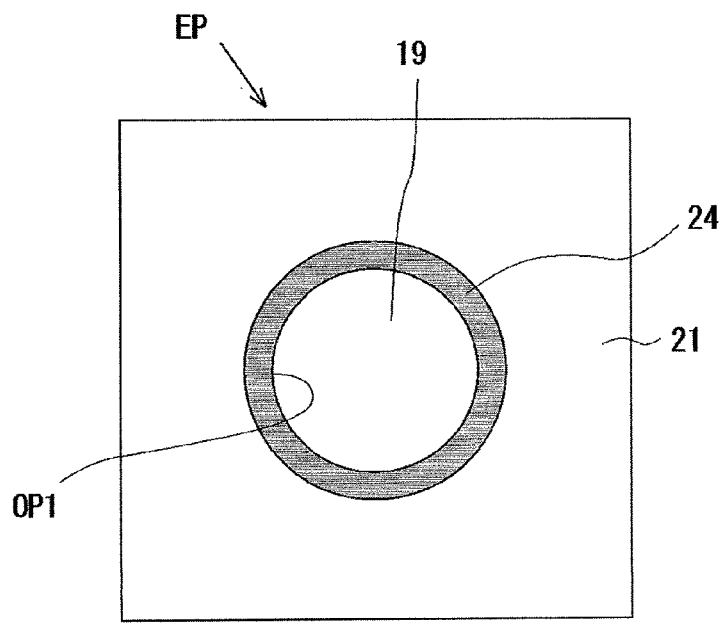
FIG. 4 is a top plan view illustrating the configuration of the vertical cavity surface emitting laser according to the first embodiment of the present invention.

FIG. 4 is a top plan view illustrating the configuration of the surface emitting laser 10 viewed from the beam radiation side.

As illustrated in FIGS. 3 and 4, a mixed composition layer 24 including the composition (or components) of the current confinement layer 21 and the composition (or components) of the transparent electrode 23 is annularly formed at the position defining the current confinement layer 21, specifically, along the edge of the current confinement layer 21. The area of the annular mixed composition layer 24 is 1% to 20%, preferably 5% or more, the area of the through opening OP1 and can be properly adjusted by changing a below-described tapered angle θ. As the tapered angle θ decreases, the area of the mixed composition layer 24 increases.

Examples of the component materials of the current confinement layer 21 may include: oxides, such as $SiO_2$, $Ga_2O_3$, $Al_2O_3$, and $ZrO_2$; and nitrides, such as SiN, AlN, and AlGaN. It is preferable to use $SiO_2$ for the current confinement layer 21. The film thickness of the current confinement layer 21 is 5 to 1000 nm, and preferably 10 to 300 nm.

Examples of the component materials of the transparent electrode 23 may include a conductive metal oxide such as ITO (Indium Tin Oxide), $In_2O_3$, IZO (In-doped ZnO), AZO (Al-doped ZnO), GZO (Ga-doped ZnO), ATO (Sb-doped $SnO_2$), FTO (F-doped $SnO_2$), NTO (Nb-doped $TiO_2$), and ZnO. It is preferable to use ITO for the transparent electrode 23. The film thickness of the transparent electrode 23 is 3 to 100 nm, and preferably 20 nm or smaller.

As illustrated in FIG. 4, the shape of the through opening OP1 is a circle with a diameter of 1 to 15 μm, and preferably 3 to 10 μm, so that a Gaussian beam can be obtained by maintaining the constant distance from the circle edge to the beam center. Thus, a current can be uniformly injected to the active layer 17, and a light beam can be uniformly confined. The shape of the through opening OP1 may be a non-circular shape, such as an ellipse or polygon, or a shape similar to a circle.

As illustrated in FIG. 3, the current confinement layer 21 has a tapered cross-sectional shape where the thickness decreases toward the mixed composition layer 24 (the edge of the through opening OP1). The tapered angle θ of the tapered cross-sectional shape of the current confinement layer 21 preferably exceeds 0 degrees and is equal to or smaller than 45 degrees.

EXAMPLE

The semiconductor structure layer SEM of the surface emitting laser 10 was designed in such a manner that the emission wavelength ranged from 400 to 450 nm. The first multilayer film reflector 13, which is an electrically-conducting mirror, was designed so as to include forty laminated pairs of GaN/InAlN. The second multilayer film reflector 25, which is a dielectric mirror, was designed so as to include eight laminated pairs of $Nb_2O_5/SiO_2$.

The predetermined semiconductor structure layer SEM was produced using the MOCVD method on a substrate. The $SiO_2$ current confinement layer 21 with a predetermined thickness on the p-GaN semiconductor layer 19 was subjected to etching or liftoff method to remove $SiO_2$ by means of chemical treatment only in the portion where the through opening OP1 (with an outer diameter of 10 μm) was to be formed.

Figure 5:
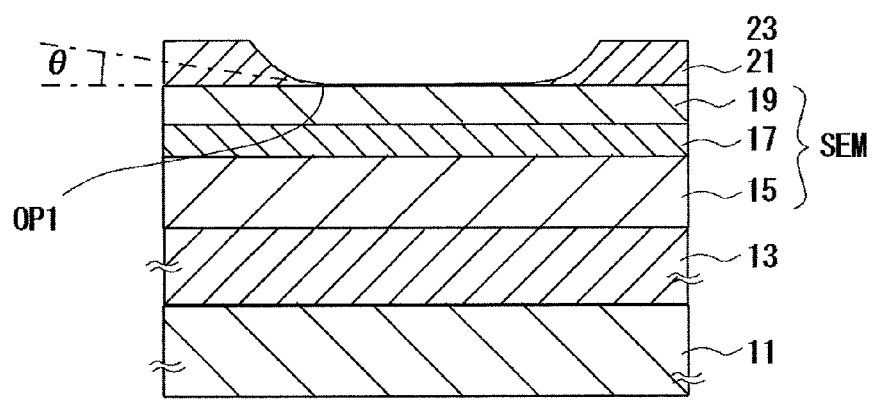
FIG. 5 is a cross-sectional view illustrating a part of the configuration of the vertical cavity surface emitting laser in the middle of manufacturing according to the first embodiment of the present invention.

The edge portion of the current confinement layer 21 formed along the through opening OP1 by the liftoff method specifically has the tapered cross-section of FIG. 5 with the tapered angle θ.

Thereafter, an ITO transparent electrode with a predetermined thickness was formed by the electron beam deposition method on the current confinement layer 21 and over the through opening OP1. The p-contact layer p-Co and the second multilayer film reflector 25 were also formed, and, as illustrated in FIG. 6, an incomplete surface emitting laser 10 without the mixed composition layer 24 was thus produced.

Figure 6:
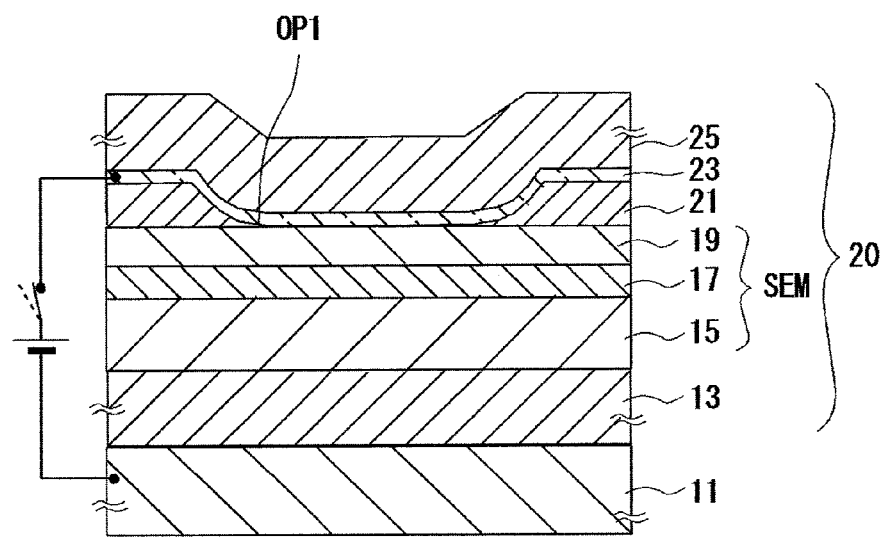
FIG. 6 is a cross-sectional view illustrating a part of the configuration of the vertical cavity surface emitting laser in the middle of manufacturing according to the first embodiment of the present invention.

As illustrated in FIG. 6, across the n-contact layer and p-contact layer p-Co of each of the incomplete surface emitting lasers 10, treatment for injecting a pulse current exceeding the normal current for laser light emission (hereinafter referred to as "excess pulse application treatment") was performed. Along the edge of the through opening, the mixed composition layer 24 with a diameter of 10 μm and a width of 200 to 400 nm was annularly produced.

Figure 7:
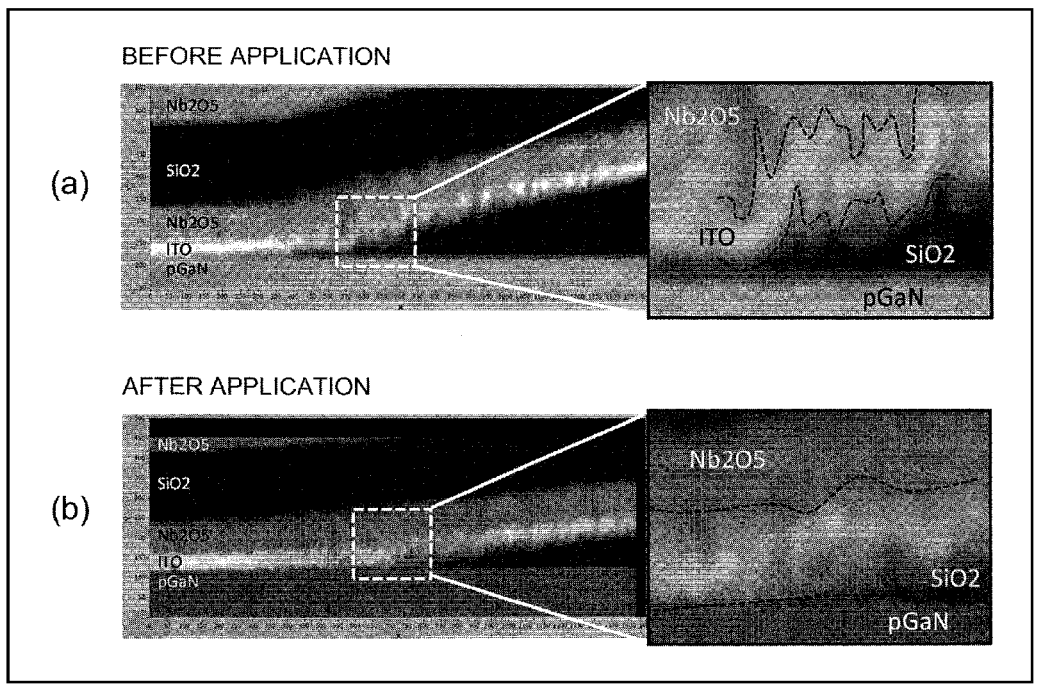
FIG. 7 includes partial cross-sectional TEM images showing an area near an edge portion of a current confinement layer on a through opening of the surface emitting laser before and after pulse current injection in a test example according to the first embodiment of the present invention.

FIG. 7 shows partial cross-sectional TEM images (a) and (b), which show an area near the edge portion of the through opening of the current confinement layer in the surface emitting laser before and after the excess pulse application treatment, respectively. On the right side of each of (a) and (b) of FIG. 7, there is shown a partially enlarged image of the interface portion (shown by a dashed line in the left side image) of each of (a) and (b) of FIG. 7.

As shown in the cross-sectional TEM images (a) and (b) of FIG. 7, when the tapered angle of the edge along the opening of the $SiO_2$ current confinement layer is small, it can be confirmed that the interface between the $SiO_2$ current confinement layer and the transparent electrode ITO is modified or altered by the excess pulse application treatment, and a mixed composition is generated (i.e., the region between the dashed lines in the right side image of (b) of FIG. 7).

Figure 8:
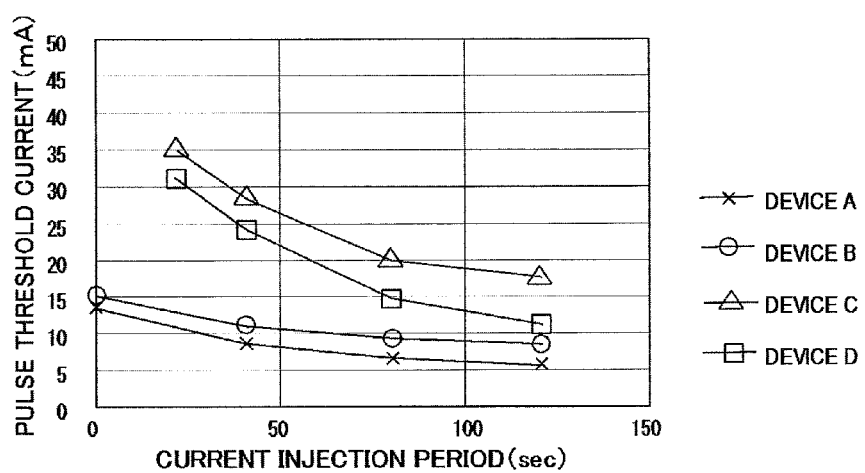
FIG. 8 is a graph showing the results of measuring threshold current changes of the completed surface emitting laser in the test example according to the first embodiment of the present invention.

The excess pulse application treatment (injected current: 40 to 50 mA) was performed for the surface emitting laser 10, whereby a composition mixture was caused to complete surface emitting lasers (i.e., devices A, B, C, and D), in order to measure threshold current changes. FIG. 8 is a graph illustrating the results. The vertical axis of FIG. 8 represents the pulse threshold current (mA), and the horizontal axis of FIG. 8 represents the current injection period (second) of the excess pulse application treatment.

The foregoing results have revealed that by mixing the compositions of the current confinement layer 21 and the transparent electrode ITO, which are $SiO_2$ and ITO, respectively, by the excess pulse application treatment for example, to form the mixed composition layer 24, the refractive index changes at the opening edge (i.e., mixed composition layer 24), and the threshold current can be further reduced. As illustrated in FIG. 8, in addition to a decrease in the threshold current, oscillation of the surface emitting lasers (devices C and D), whose pulse laser oscillation was not initially confirmed, has been confirmed to occur after forming the mixed composition layer 24.

To decrease the tapered angle of the current confinement layer 21 to cause composition mixture by means of the excess pulse application treatment (specifically, to appropriately adjust the tapered angle θ), it has been experimentally found preferable to employ the liftoff method to remove the $SiO_2$ layer at the opening. The experimental results have also revealed that a composition mixture of the ITO of the transparent electrode 23 and $SiO_2$ is noticeable at least at an edge portion near the edge of the through opening where the film thickness of the $SiO_2$ layer of the current confinement layer 21 is 20 nm or lower.

As described above, according to the embodiment, the threshold current can be controlled on the basis of the application time period of the excess pulse application treatment for generating the mixed composition layer 24. A uniform threshold current can be applied to a plurality of the surface emitting lasers 10 in a wafer during manufacturing. The embodiment is particularly advantageous for improving the manufacturing yield of arrayed surface emitting lasers.

Second Embodiment

Figure 9:
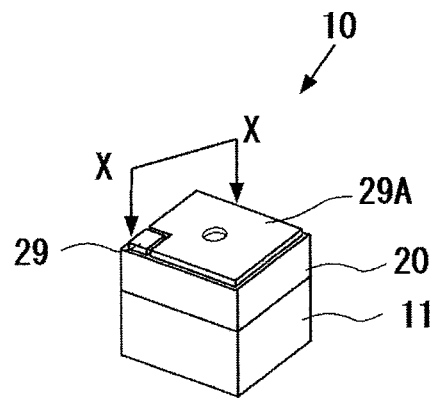
FIG. 9 is a perspective view illustrating an outer appearance of a vertical cavity surface emitting laser according to a second embodiment of the present invention.
Figure 10:
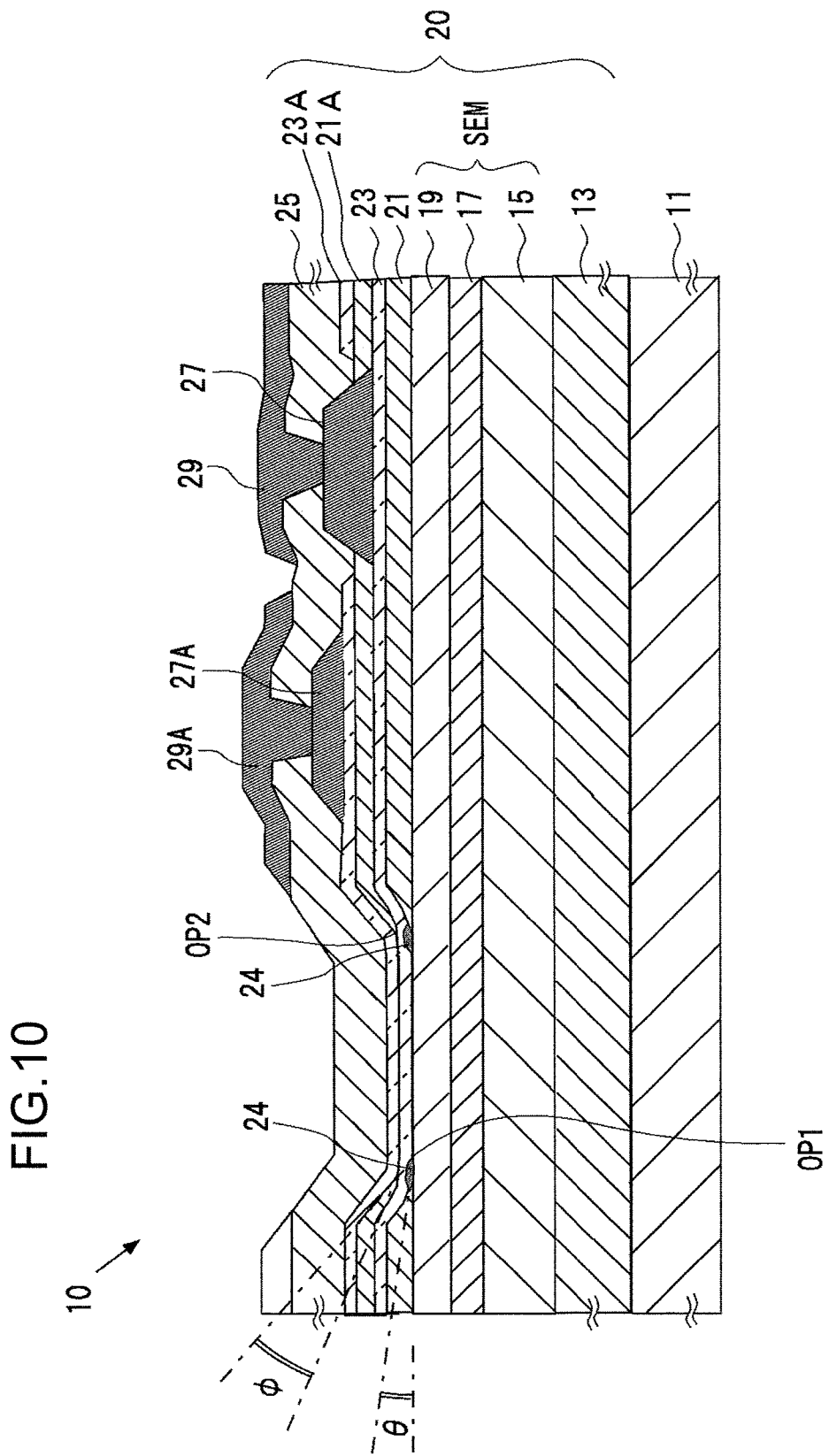
FIG. 10 is a partial cross-sectional view schematically illustrating a part of the vertical cavity surface emitting laser along a line XX of FIG. 9.

FIG. 9 is a perspective view illustrating an outer appearance of one surface emitting laser 10 according to a second embodiment of the present invention. FIG. 10 is a partial cross-sectional view schematically illustrating a part of the surface emitting laser 10 along a line XX of FIG. 9.

As illustrated in FIG. 10, in addition to the current confinement layer 21 and the transparent electrode 23 of the first embodiment, the surface emitting laser 10 according to the second embodiment further includes an insulation layer 21A and a driving transparent electrode 23A. Other elements of the second embodiment are substantially identical to those of the first embodiment, and a description of the configuration and operations of the elements to which the same reference numerals are assigned will be omitted here.

The surface emitting laser 10 according to this embodiment has a threshold current adjustment electrode 27 connected to the transparent electrode 23 and a pad electrode 29 that connects the threshold current adjustment electrode 27 to an outside element. Also, the surface emitting laser 10 according to this embodiment has a drive electrode 27A connected to the driving transparent electrode 23A and a driving pad electrode 29 that connects the drive electrode 27A to an outside element. When adjusting the threshold current after the pad electrode formation process, the second multilayer film reflector 25 on the threshold current adjustment electrode 27 should be removed, and two pad electrodes should be used to conduct separation between the driving side and the threshold current adjustment side. The threshold current adjustment pad electrode 29 can be disposed anywhere other than the opening as long as the threshold current adjustment pad electrode 29 is electrically insulated from the driving pad electrode 29A on the upper surface of the device.

In this embodiment, the insulation layer 21A has an annular upper-portion opening OP2 disposed in coaxial with the through opening OP1 of the current confinement layer 21. On the edge of the upper-portion opening OP2, the insulation layer 21A has a tapered cross-sectional shape that tapers toward the mixed composition layer 24 above the tapered cross-sectional shape of the current confinement layer 21.

The driving transparent electrode 23A covers the upper-portion opening OP2 of the insulation layer 21A and is in contact with and electrically connected to the transparent electrode 23.

In this embodiment, a tapered angle φ at the edge of the upper-portion opening OP2 of the insulation layer 21A is greater than the tapered angle θ at the edge of the opening OP1 of the current confinement layer 21.

The current confinement layer 21 on the p-type semiconductor layer 19 is formed so that the tapered angle θ is smaller, and a film of the transparent electrode 23 is formed thereon. The transparent electrode 23 is used for threshold current adjustment. Via the threshold current adjustment electrode 27, an excessive pulse current is injected from the pad electrode 29 to the current confinement layer 21 (i.e., edge portion of the opening thereof) which is in contact with the interface between the transparent electrode 23 and the p-type semiconductor layer 19. By means of Joule heat, the transparent electrode 23 and the current confinement layer 21 are mixed to form the mixed composition layer 24.

The upper-portion opening OP2 of the insulation layer 21A on the transparent electrode 23 is formed by, for example, an etching method so that the tapered angle φ is greater, and a film of the driving transparent electrode 23A is formed thereon. The driving transparent electrode 23A is used for driving the surface emitting laser 10.

Figure 11:
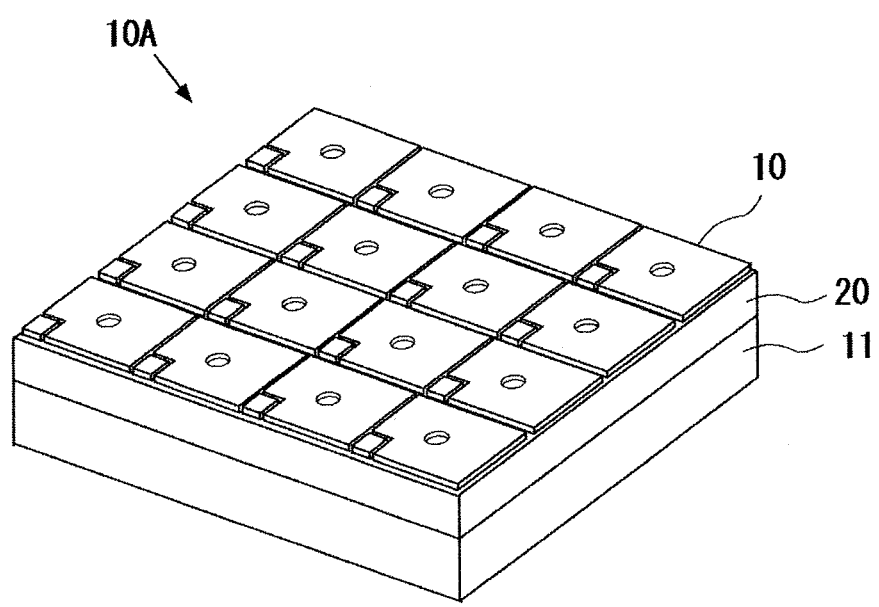
FIG. 11 is a perspective view illustrating an outer appearance of a vertical cavity surface emitting laser according to a modified example of the second embodiment of the present invention.

FIG. 11 is a perspective view illustrating an outer appearance of the surface emitting laser 10A in which sixteen surface emitting lasers according to the second embodiment of the present invention as the light emitting portions are arranged in a 4-by-4 array fashion.

Third Embodiment

Figure 12:
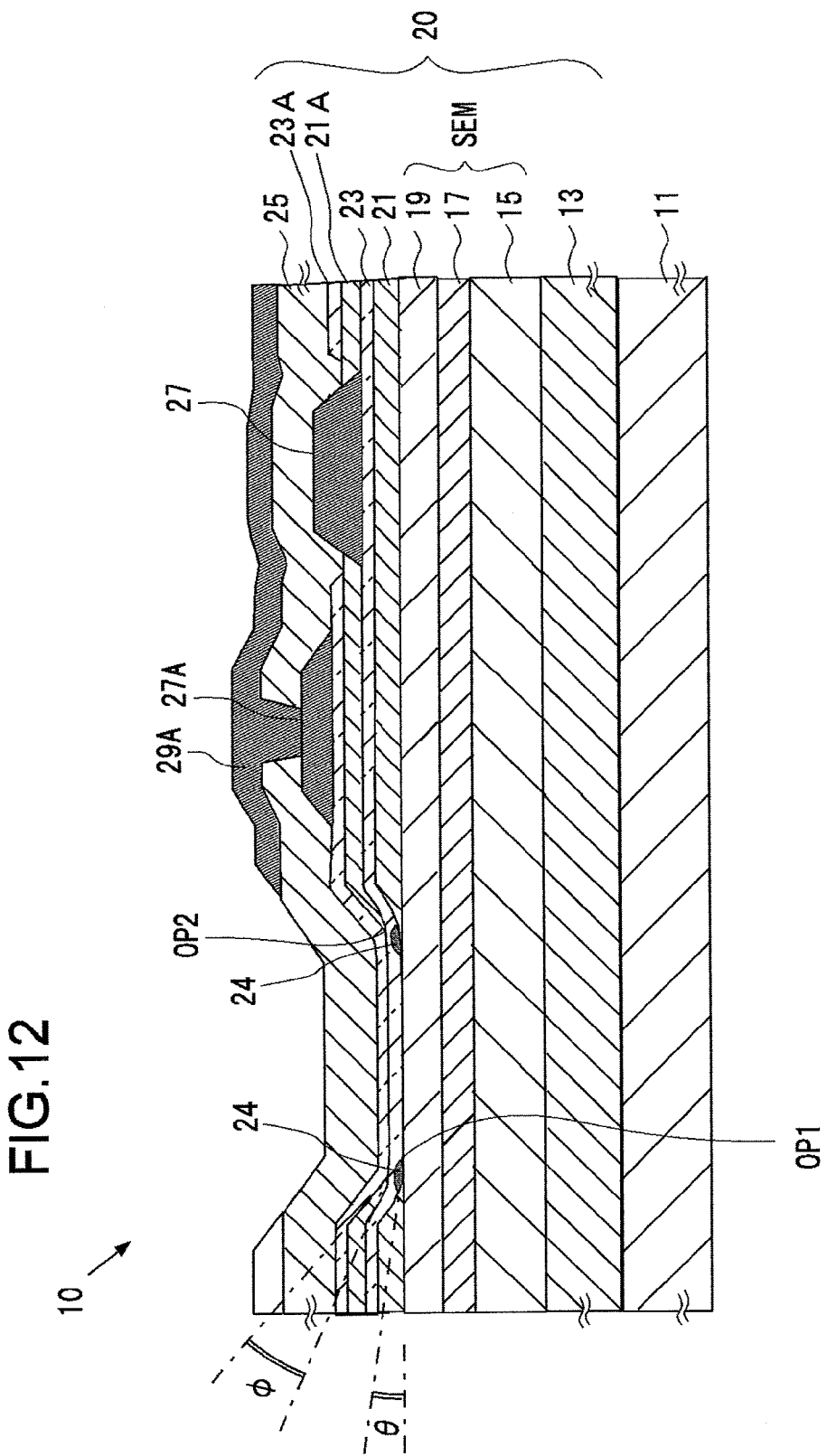
FIG. 12 is a perspective view illustrating an outer appearance of a vertical cavity surface emitting laser according to a third embodiment of the present invention.

FIG. 12 is a partial cross-sectional view of a surface emitting laser 10 according to a third embodiment of the present invention.

As illustrated in FIG. 12, the elements of the surface emitting laser 10 according to the third embodiment are substantially identical to those of the surface emitting laser 10 according to the second embodiment except that the pad electrode 29 for threshold current adjustment is not provided according to the third embodiment. A description of the configuration and operations of the elements to which the same reference numerals are assigned will be omitted here.

After the process of forming the threshold current adjustment electrode 27 connected to the transparent electrode 23, which is illustrated in FIG. 12, the threshold current may be adjusted by forming the mixed composition layer 24 by performing the excess pulse application treatment. In this case, the threshold current adjustment electrode 27 may be buried under the second multilayer film reflector 25.

Since two transparent electrode layers are employed, as illustrated in FIG. 13, the film thickness of the transparent electrodes at the opening increases, and a resulting increase in absorption is of concern. A modified example of FIG. 13 may be configured such that the ITO layer, which is a part of the driving transparent electrode 23A in the opening OP2, is removed or absent and the transparent electrode 23 for threshold current adjustment remains as it is.

As described in the foregoing, the surface emitting laser according to the present invention reduces the threshold current (power consumption) of the surface emitting laser itself and improves the manufacturing yield of the surface emitting lasers. In particular, the surface emitting laser according to the present invention is advantageous in reducing differences between the threshold currents of a plurality of surface emitting lasers when the surface emitting lasers are arrayed.

Any of the embodiments of the present invention may be applied to a surface emitting laser configured to have an active layer of a quantum well (QW) structure as the active layer 17. The configuration where the semiconductor structure layer SEM comprises a GaN (gallium nitride) semiconductor has been explained, but the crystal system is not limited thereto. Also, the aforementioned embodiments may be appropriately modified or combined to each other. The present invention may be applied not only to a laser, but also to a vertical cavity light emitting device.

This application is based on a Japanese Patent Application No. 2015-227165 which is hereby incorporated by reference.

What is claimed is:

1. A vertical cavity light emitting device comprising:
a first multilayer film reflector formed on a substrate;
a semiconductor structure layer that is formed on the first multilayer film reflector and includes a semiconductor layer of a first conductivity type, an active layer, and a semiconductor layer of a second conductivity type which is opposite to the first conductivity type;
an insulating current confinement layer formed on the semiconductor layer of the second conductivity type;
a through opening that is formed in the current confinement layer to penetrate the current confinement layer;
a transparent electrode for covering the through opening and the current confinement layer, the transparent electrode being in contact with the semiconductor layer of the second conductivity type through the through opening;
a second multilayer film reflector formed on the transparent electrode; and
a mixed composition layer that is formed so as to be in contact with an edge of the through opening and in which the current confinement layer and the transparent electrode are mixed.

2. The vertical cavity light emitting device according to claim 1, wherein the mixed composition layer is annularly formed on the semiconductor layer of the second conductivity type.

3. The vertical cavity light emitting device according to claim 1, wherein the current confinement layer has a tapered cross-sectional shape where a thickness thereof decreases towards the mixed composition layer.

4. The vertical cavity light emitting device according to claim 3, wherein a tapered angle of the tapered cross-sectional shape of the current confinement layer exceeds 0 degrees and is equal to smaller than 45 degrees.

5. The vertical cavity light emitting device according to claim 1, wherein the current confinement layer comprises $SiO_2$, and the transparent electrode comprises a metal oxide.

6. The vertical cavity light emitting device according to claim 1, wherein a film thickness of the current confinement layer at the through opening adjacent to the mixed composition layer is 20 nm or lower.

7. The vertical cavity light emitting device according to claim 1, further comprising:
   an insulation layer that has an upper opening disposed in coaxial with the through opening of the current confinement layer and has, at an edge of the upper opening, a tapered cross-sectional shape where a thickness decreases towards the mixed composition layer on a part of a tapered cross-sectional shape of the current confinement layer; and
   a driving transparent electrode for covering the upper opening, the driving transparent electrode being in contact with the transparent electrode.

8. The vertical cavity light emitting device according to claim 7, wherein a tapered angle of the tapered cross-sectional shape of the insulation layer is greater than a tapered angle of the tapered cross-sectional shape of the current confinement layer.

9. The vertical cavity light emitting device according to claim 7, further comprising a pad electrode and a driving pad electrode independently connected to the transparent electrode and the driving transparent electrode, respectively.

* * * * *